(12) United States Patent
Janot

(10) Patent No.: US 8,527,574 B2
(45) Date of Patent: Sep. 3, 2013

(54) DEVICE AND METHOD FOR HIGH RESOLUTION TIME MEASUREMENTS

(75) Inventor: Stephan Janot, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1112 days.

(21) Appl. No.: 12/307,349

(22) PCT Filed: Jun. 18, 2007

(86) PCT No.: PCT/EP2007/005353
§ 371 (c)(1),
(2), (4) Date: Jun. 18, 2009

(87) PCT Pub. No.: WO2008/003397
PCT Pub. Date: Jan. 10, 2008

(65) Prior Publication Data
US 2010/0001780 A1    Jan. 7, 2010

(30) Foreign Application Priority Data

Jul. 7, 2006 (DE) .......................... 10 2006 031 558
Jul. 17, 2006 (DE) .......................... 10 2006 032 962

(51) Int. Cl.
*G04F 10/06* (2006.01)
*G06G 7/18* (2006.01)

(52) U.S. Cl.
USPC .............................................. 708/813; 708/5

(58) Field of Classification Search
None
See application file for complete search history.

(56) References Cited

U.S. PATENT DOCUMENTS

| | | | | | |
|---|---|---|---|---|---|
| 2,800,583 | A | * | 7/1957 | Gerks | 327/40 |
| 3,395,340 | A | * | 7/1968 | Anstey et al. | 324/615 |
| 4,648,276 | A | * | 3/1987 | Klepper et al. | 73/599 |
| 2002/0181547 | A1 | * | 12/2002 | Feher | 375/130 |
| 2005/0024120 | A1 | | 2/2005 | Chang | |

FOREIGN PATENT DOCUMENTS

| | | |
|---|---|---|
| DE | 25 48 799 C3 | 5/1976 |
| DE | 689 07 246 T2 | 12/1993 |
| DE | 10 2005 050 151 B3 | 11/2006 |
| EP | 0 529 875 A2 | 3/1993 |
| EP | 1 496 410 A1 | 1/2005 |
| EP | 1 701 145 A2 | 9/2006 |
| GB | 1 496 837 | 1/1978 |

* cited by examiner

*Primary Examiner* — Ilwoo Park
(74) *Attorney, Agent, or Firm* — Christensen O'Connor Johnson Kindness PLLC

(57) ABSTRACT

The invention relates to a device for determining the temporal position of an analogue trigger signal with relation to an analogue clock signal, comprising an analogue cross-correlator (30), which carries out an analogue cross-correlation between the trigger signal and clock signal to provide a fine resolution.

16 Claims, 8 Drawing Sheets

DEVICE AND METHOD FOR HIGH RESOLUTION TIME MEASUREMENTS

The invention relates to a system and a method for high-resolution time measurements in systems with a limited bandwidth.

The basic structure of a time-measurement-system for high-resolution time measurements will first be presented with a brief explanation of the relationship between the time resolution of a system and its bandwidth. The problems of previous measurement methods with regard to a finite steepness of trigger slopes and a desired, high time resolution are then presented. The method to be patented for the realisation of high-resolution time measurement with relatively flat trigger-signal slopes is then explained. This includes a theoretical derivation of the anticipated properties of the method and also an explanation of the realisation.

With regard to the background, reference is made to US 2005/0024120, which discloses a device for the control of dual-slope integrator.

In a great many measuring systems, there is a requirement to determine the exact time of occurrence of a given event within a received signal, or to evaluate a received signal in a temporal relationship with a trigger event. Within a measuring system of this kind as illustrated in FIG. 1, the received signal [rec(t)] from a signal source (DUT) 8 to be tested is received via an analog receiver component (front-end) 1. The data are then converted (A/D) in an analog/digital converter 7 and stored in an acquisition memory 3. In many cases the data are registered in an uninterrupted manner in a ring memory. The data are then generally displayed on a screen 5. In this context, it is important that the time difference relative to an external trigger signal or respectively to a trigger slope within the received signal is known. This time is measured continuously during the recording of the data and can then be taken into consideration by a correct alignment of the data in the memory 3 before presenting the results.

The required resolution of a time measurement of this kind depends substantially upon the bandwidth of the test system. In the case of periodically-recurring signals, it can be expected that the recording or respectively the evaluation of received data is always implemented at the same time relative to a trigger event or a selected slope of the signal. If periodically-recurring measured data are presented graphically as curves, an inaccurate temporal synchronisation leads to a fluctuation (jitter) of the curve displayed on screen 5. To realise a fluctuation of the curve, which is hardly perceptible to the human eye, a time resolution of less than 1% of the period ($T_{signal}$) of the signal is required. The minimum period ($T_{signal}$) of a presentable signal depends upon the bandwidth ($BW_{signal}$) of the measuring system.

The required temporal resolution $dt_{resolution}$ of a time-measuring system must be less than 1/100 of the period of the measured signal. It therefore follows that the bandwidth $BW_{resolution}$ of the time-measuring system must be greater than the one hundred times the bandwidth of the received signal. In measuring systems with a broad signal bandwidth, this often approaches the limits of the components used. The goal of most developments is to make the signal bandwidth as broad as possible. This leads to a miniaturisation of components and/or to an integration of the functionality within a semiconductor chip. If a measuring system is integrated within a switching circuit, the signal bandwidth is generally limited by the semiconductor technology used. Now, if a time-acquisition system with the required resolution of 1% of the smallest signal period is to be realised, the required bandwidth $BW_{resolution}$ generally exceeds the specifications of the semiconductor technology by a large factor.

In order to realise a time measurement, it is initially necessary to establish accurately the beginning and the end of a measurement. The beginning and the end of a time measurement are conventionally marked, as presented in FIG. 2, by trigger slopes or respectively system-clock slopes. The steepness of a slope of this kind significantly influences the accuracy of the system. Accordingly, with most measurement concepts, the rise times of such slopes are disposed within the order of magnitude of the desired time resolution $dt_{resolution}$. The flatter this slope is, the less accurate the time measurement will generally be.

There are various possibilities for realising a time measurement on the basis of an accurate trigger slope or respectively clock slope of this kind, which will not be discussed in greater detail at present. Most methods are based upon the fact that a trigger or signal event is measured against a stable system clock. In this context, the system clock forms the time normal of the measuring system. The measurement is generally subdivided into two measuring tasks. On the one hand, a coarse measurement 10, which measures time differences in multiples of the system clock; and on the other hand, a fine measurement 11, which is supposed to measure the time in fractions of the system clock. The resolution capability of the overall system is determined exclusively by the fine time measurement 11. The properties of this fine time measurement 11 depend heavily upon the signal form of the trigger slope or respectively system-clock slope at the input. The overall differences are calculated in the unit 12.

Accordingly, the problem is to generate high-precision and rapid trigger slopes or respectively system-clock slopes, of which the time difference can be measured accurately. According to the above deliberations, the resolution of the time measurement required within a system with 10 GHz signal bandwidth is less than 1 ps:

$$dt_{resolution} \leq \frac{T_{signal}}{100} = \frac{1}{100 \cdot BW_{signal}} = \frac{1}{10^{12}} = 1 \text{ ps}$$

The rise time of the trigger slope or respectively system clock slope in this context should be disposed, for example, in the order of magnitude of one or more ps, but, in general, a value of 5 ps should not be exceeded. This would lead to a bandwidth of the trigger component within an order of magnitude from 200 . . . 1000 GHz. With most currently-available semiconductor technologies, such large bandwidths are attainable only with difficulty if at all.

In view of these technological restrictions, the object is to provide a measuring method and a device for fine time measurement, which allows a high resolution time measurement even with relatively-slow trigger slopes. The required bandwidth of the measuring system should therefore be disposed within the same order of magnitude as the system clock.

The object is achieved with reference to the measuring method by the features of claim 1 and with reference to the device by the features of claim 8.

The object of the invention is to realise a method and a device for high-precision time measurement with systems, of which the bandwidth is below the bandwidth of the desired time resolution. In this context, with relatively-flat trigger-signal slopes, a time resolution of a trigger event should be achieved within the range of one hundredth of the slope rise time.

The system clock pulse within a measuring system is, for example, 10 GHz. Slopes with a maximum rise rate of, for example, 10 mV/ps can therefore be realised. The desired time resolution should be disposed below one hundredth of the clock-pulse period and should therefore be smaller than, for example, 1 ps. The maximum available bandwidth of the system is then 20 GHz.

In this context, the time measurement of a trigger event should be related to a fixed clock reference. This system clock therefore forms the time normal of the system. Most previous time-measuring methods are based upon the fact that the time measurement begins with the trigger-signal slope and ends with the occurrence of a subsequent clock slope. In order to establish the beginning and the end of the time measurement accurately, this presupposes that the corresponding trigger slope and respectively clock slope provides a very steep gradient.

If the method according to the invention described here is used, an accurate time measurement can be realised even with relatively-flat trigger slopes. In this context, a time measurement is referred back to a phase measurement of the cross correlation function (CCF) of a trigger-signal function with the system clock. Accordingly, a signal characteristic, which resembles the system clock as much as possible, and the length of which is disposed within the order of magnitude of one clock-pulse period, is generated from a trigger slope. Since this trigger-signal characteristic is similar in form and length to one period of the system clock, only the same bandwidths, which are also necessary for the provision and processing of the system clock, are required. This means that the trigger slopes also need not be steeper than the slopes of the system clock.

Furthermore, with regard to the correlations, the signal-noise ratio improves with an increasing correlation length. To this extent, a relatively-long trigger signal relative to the system clock tends to be beneficial. The operation of calculating the cross correlation in this context is preferably realised with analog circuit elements.

Exemplary embodiments of the invention are explained below with reference to the drawings. The drawings are as follows.

Figure 1:
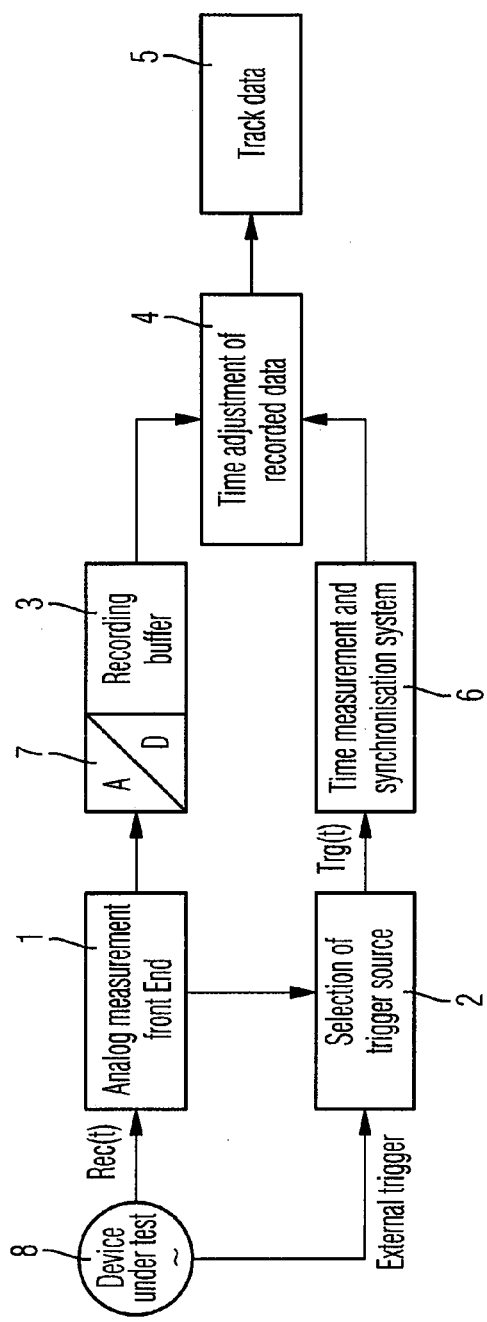
FIG. 1 shows the basic structure of a measuring system with time synchronisation of the received signal.
Figure 2:
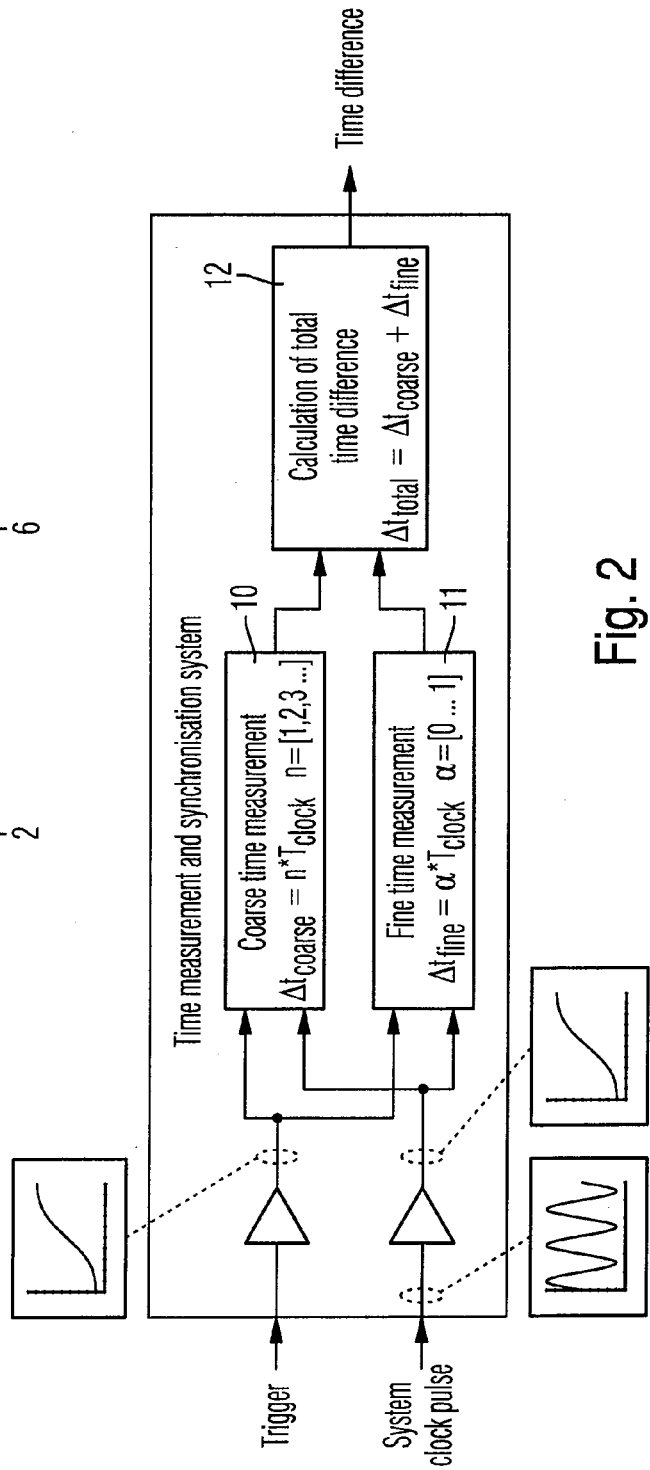
FIG. 2 shows the basic structure of a time-measuring system based upon a system clock as the time normal.

Initially, the signal properties of the signals must be observed. The cross correlation properties between the system clock and the trigger signal must be as good as possible. For a sinusoidal clock pulse, this means that the trigger-signal form should be as similar as possible to an excerpt from a sinusoidal signal. Since the phase of the cross correlation function is used as the basis for the time measurement, the operation must be implemented for the real component and as well as for the imaginary component of the system clock. This presupposes that the form of the trigger signal is the same for both branches. The correlation length determines the signal/noise ratio. In this context, a value between one half clock period and one whole clock period is realistic.

A theoretical derivation of a favourable signal form for the trigger pulse will first be presented. The cross correlation function (CCF) of two signals g(t) and s(t) can be calculated as follows:

$$CCF = \int_{-\infty}^{\infty} s(t) \cdot g(t - \tau) dt$$

wherein:
CCF—cross correlation function
g(t)—system clock pulse
s(t)—signal form of the trigger impulse
τ—time displacement of the trigger signal relative to the timing of the zero phase of the system clock pulse.

A complex rotary phasor is now assumed for the system clock pulse (g(t)). This can be generated in hardware from a purely-real clock pulse via a 90° hybrid coupler.

$$g(t) = \exp(j\omega t) = \cos(\omega t) + j\sin(\omega t) \mid \omega = \frac{2\pi}{T}$$

wherein:
ω—angular frequency of the system clock
T—period of the system clock.

In the case of the rotary phasor, a time difference (τ) in the argument of the function g(t) can also be expressed as a phase difference ($\phi_0$) of the function value.

$$\begin{aligned} g(t-\tau) &= \exp(j\omega\{t-\tau\}) \\ &= \exp(j\{\omega t - \varphi_0\}) \\ &= \cos(\omega t - \varphi_0) + j \cdot \sin(\omega t - \varphi_0) \mid \varphi_0 \\ &= 2\pi \frac{\tau}{T} \end{aligned}$$

$$g(t-\tau) = \exp(j\omega t) \cdot \exp(-j\varphi_0) = g(t) \cdot \exp(-j\varphi_0)$$

wherein:
τ—time displacement of the trigger signal relative to the timing of the zero phase of the system clock
$\phi_0$—phase of the system clock at the time of occurrence of the trigger signal.

In view of the above equation, the cross correlation can be formulated as follows:

$$\begin{aligned} CCF &= \int_{-\infty}^{\infty} s(t) \cdot g(t-\tau) dt \\ &= \exp(-j\varphi_0) \cdot \int_{-\infty}^{\infty} s(t) \cdot g(t) dt = \\ &= \exp\left(j \cdot 2\pi \frac{\tau}{T}\right) \cdot \int_{-\infty}^{\infty} s(t) \cdot \exp(j\omega t) dt \end{aligned}$$

In order to determine the trigger time relative to the system clock, the phase of the cross correlation function must now be evaluated.

$$\varphi_{CCF}(CCF) = \varphi_{CCF}\left[\exp(-j\varphi_0) \cdot \int_{-\infty}^{\infty} s(t) \cdot \exp(j\omega t)\,dt\right]$$

$$= \varphi_{CCF}[\exp(-j\omega_0) \cdot h(\omega)] \mid h(\omega)$$

$$= \int_{-\infty}^{\infty} s(t) \cdot \exp(j\omega t)\,dt$$

The expression of the complex integral h(φ) within the CCF corresponds to the value of the Fourier integral of the function s(t) at the frequency (F) of the system clock where:

$$F = \frac{\omega}{2\pi} = \frac{1}{T} \quad \Big| \quad h(\omega) = \int_{-\infty}^{\infty} s(t) \cdot \exp(j\omega t)\,dt$$

Every complex number, and therefore also h(ω), can be analysed into a modulus and a phase.

$$h(\omega) = |h(\omega)| \cdot \exp\{j \cdot \phi_h(h(\omega))\}$$

The phase of the cross correlation function is therefore calculated from the sum of the phase value ($\phi_0$) dependent upon τ and a constant phase value ($\phi_h$) of the Fourier transform of s(t). The signal/noise ratio SNR of this phase value is determined by the modulus of the function |h(ω)|.

This corresponds to the modulus of the Fourier transform of s(t) at the position F=1/T.

$$\varphi_{CCF}(CCF) = \varphi_{CCF}[\exp\{-j\varphi_0\} \cdot |h(\omega)| \cdot \exp\{j \cdot \varphi_h(h(\omega))\}] =$$

$$= \varphi_{CCF}[\exp\{\varphi_h - \varphi_0\} \cdot |h(\omega)|]$$

$$\varphi_{CCF}(CCF) = \{\varphi_h - \varphi_0\} = \left\{\varphi_h - 2\pi\frac{\tau}{T}\right\}$$

From this equation, the value for the relative time difference of the trigger signal relative to the system clock τ can now be determined:

$$\tau = \frac{T}{2\pi}\{\varphi_h - \varphi_{CCF}[CCF]\} = \frac{T}{2\pi}\left\{\varphi_h - \varphi_{CCF}\left[\int_{-\infty}^{\infty} s(t) \cdot g(t-\tau)\,dt\right]\right\}$$

The realisation of the cross correlation (CCF) in an analog chip will now be described.

As has been shown, the signal to noise ratio SNR of the measurement depends significantly upon the form of the trigger signal s(t). The modulus of the Fourier transform of s(t) at the frequency of the system clock |h(ω)| must be used in order to evaluate a favourable form.

Figure 3:
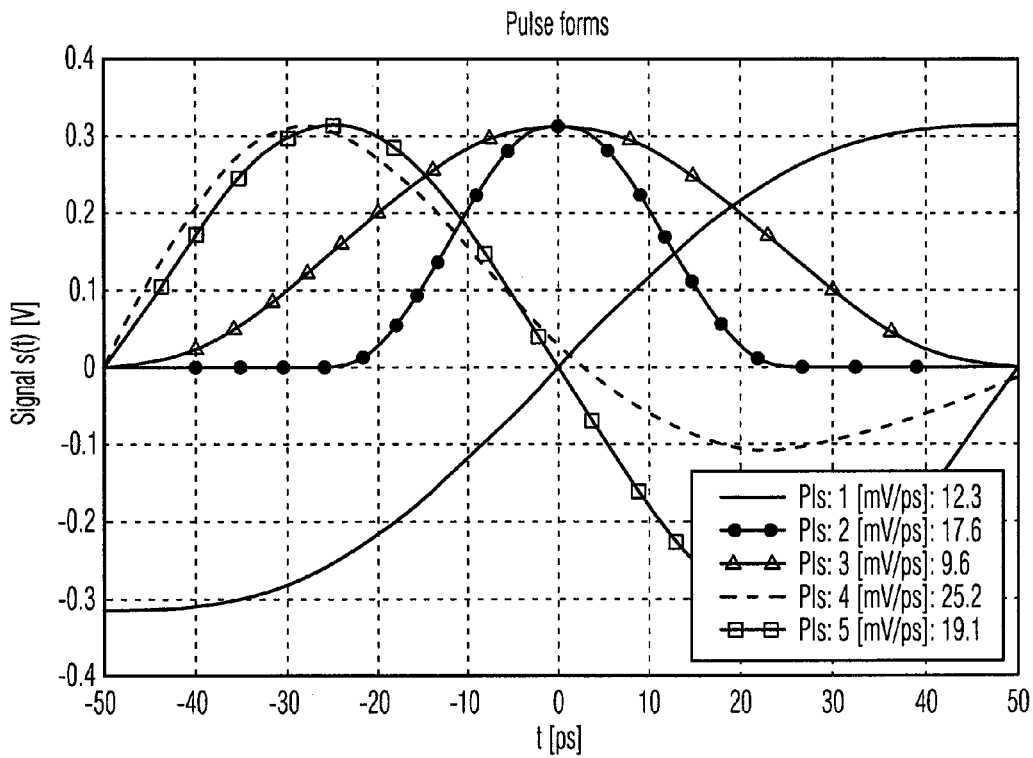
FIG. 3 shows investigated trigger-signal forms s(t) scaled to an identical maximum of the signal.
Figure 4:
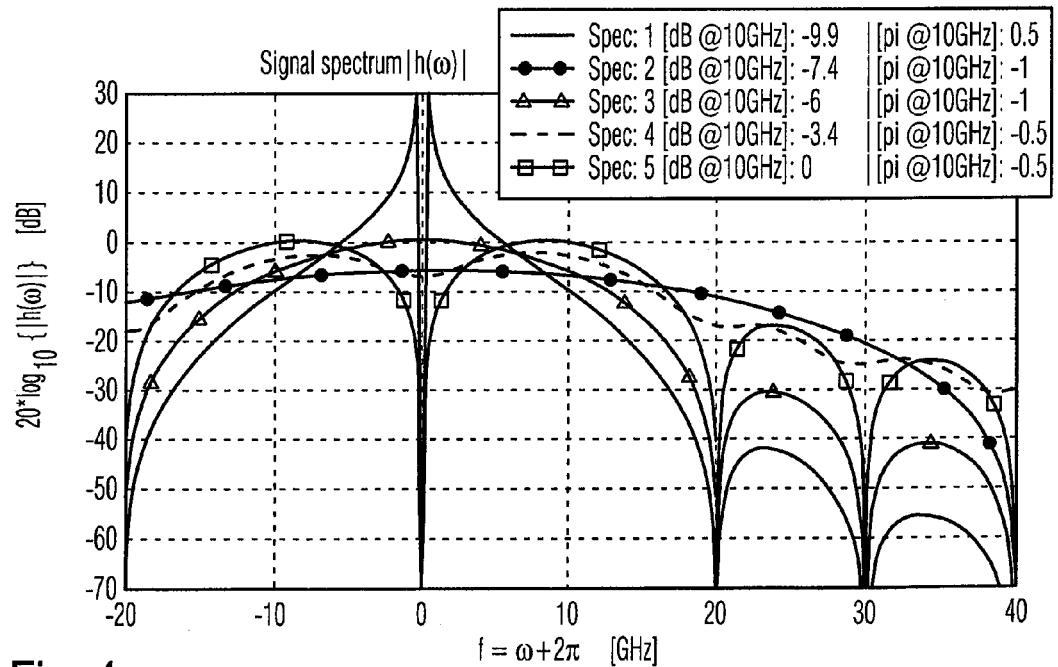
FIG. 4 shows the spectrum of the investigated trigger-signal forms.

FIG. 3 illustrates various possible trigger-pulse forms, and their spectra are compared with one another in FIG. 4. Starting from a simple slope (Spec: 1) through to an attenuated sinusoidal oscillation (Spec: 5), these signal forms can be realised on an analog chip. The value for the maximum steepness of the signal is indicated in the legend. For this purpose, it has been assumed that the realisable signal deviation is approximately +300 mV.

With reference to the spectrum shown in FIG. 4, it is evident that a simple trigger slope (Spec: 1) provides the poorest correlation properties. At 10 GHz, the relative power is approximately −10 dB. By experience, a sinusoidal signal of frequency 10 GHz provides the best correlation properties. At 10 GHz, the relative power is 0 dB. However, the realisation of an un-attenuated sinusoidal signal of 10 GHz, which begins with the occurrence of the trigger event, is extremely difficult. Realisable signal forms were then investigated with the signal forms Spec 2 to Spec 4, which provide better correlation properties than a simple signal slope. In this context, a marginal condition applies that the maximum slope steepness is disposed in the order of magnitude of 15 mV/ps. It can be shown that a simple Gaussian pulse (Spec 2 and Spec 3), which can be generated by differentiation of one slope, already provides substantially better correlation properties. The width of the pulse has a slight influence on the correlation property, so long as the length of a clock period is not exceeded. Even better correlation properties would be obtained, if an attenuated sinusoidal signal were used instead of a pulse. In this context, the frequency also plays a subordinate role, so long as it is greater than half the clock-pulse frequency. A curve form of this kind can be achieved by initiating a resonant circuit of poor quality (Q=[2 . . . 4]).

With all signal forms, it is important that the signal widths are kept sufficiently small. If the signal is wider than one clock period, the zero point wanders in the spectrum from the original 20 GHz to 10 GHz. Under these circumstances, a cross correlation with adequate signal amplitude is no longer possible at all.

Figure 5:
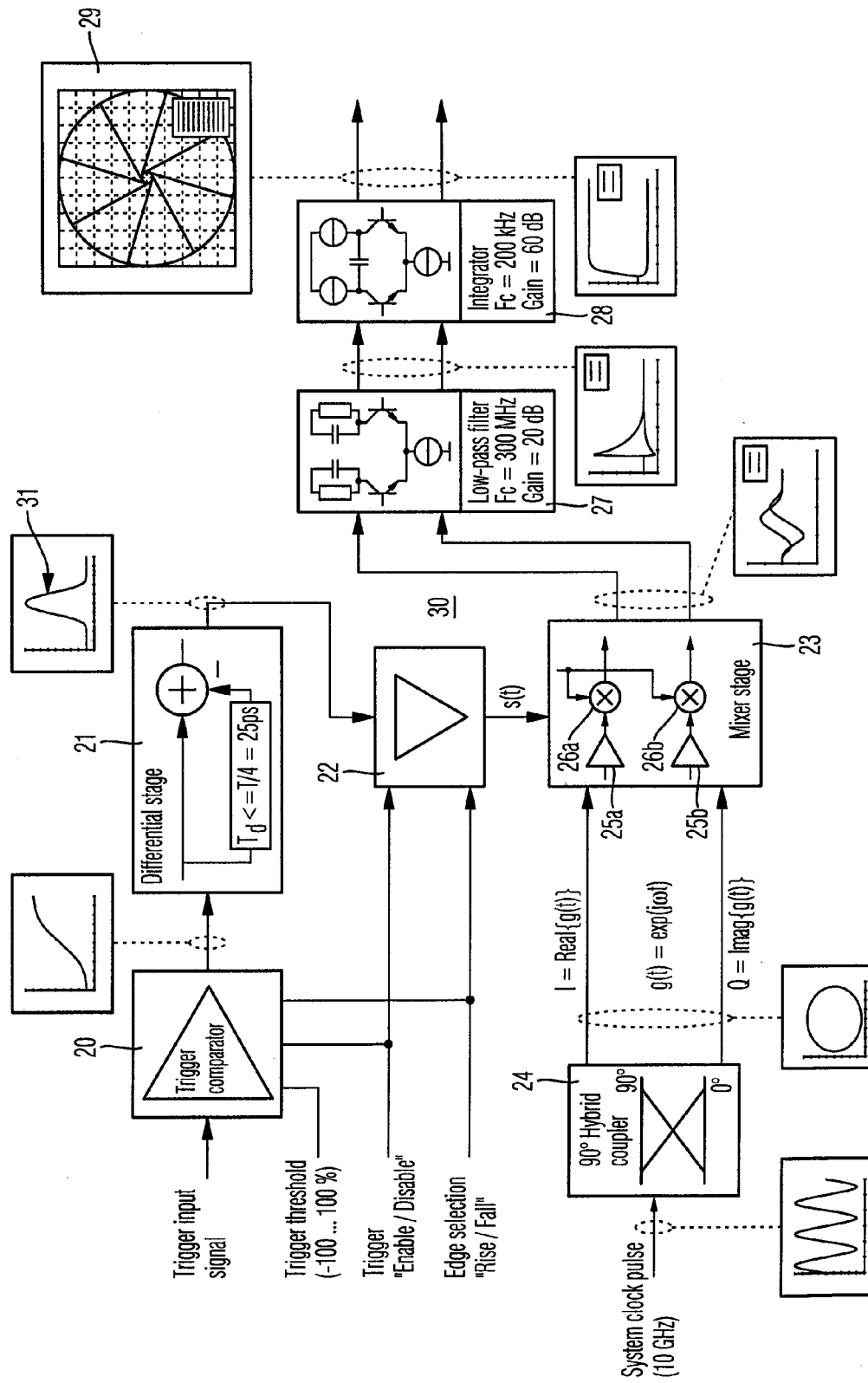
FIG. 5 shows a block-circuit diagram of the trigger-time detector according to a first exemplary embodiment, which operates using the cross correlation of the system clock and a known trigger function.

FIG. 5 shows a first exemplary embodiment of the device according to the invention. An input signal is supplied to a trigger comparator 20, which compares the level of the input signal with a trigger threshold value and connects through only if the threshold value is exceeded. The input comparator is preferably followed by an RS flip-flop, which is not illustrated in FIG. 5, in order to realise the maximum possible steepness of the trigger signal. A "trigger-RESET" signal, with which the flip-flop can be reset or respectively deactivated, is then provided at the RS flip-flop. An "Edge Select" signal, with which a selection between the rising slope and the falling slope of the trigger signal can be made, is supplied.

A differential stage 21, which implements an analog differentiation of the input signal, is connected to the trigger comparator 20. The differentiated input signal is then supplied via an amplifier 22 to an analog, complex mixer unit 23. As a result of the differentiation, a Gaussian-like pulse 31 is obtained from a simple signal slope.

The system clock is broken down in a 90° hybrid coupler into its real component I and its imaginary component Q and then supplied to a complex mixer 23. The complex mixer 23 has a pre-amplifier 25a and 25b respectively for the real component I and the imaginary component Q, and a mixer stage 26a and 26b respectively for the real component I and the imaginary component Q. The complex output signal from the mixer 23 is supplied via an optional low-pass filter 27, which is not absolutely necessary, to an analog integrator 28. The output signal of the integrator 28 is digitised via an analog/digital converter, which is not illustrated in FIG. 5, and then further digitally processed and finally displayed in the I/Q plane in a display device 29.

In the case of the exemplary embodiment according to FIG. 5, the cross correlator therefore consists of the analog complex mixer 23, the low-pass filter 27 and the integrator 28.

As described above, the synchronisation of the trigger signal with the system clock can be determined by a cross correlation integral.

$$\tau = \frac{T}{2\pi}\left\{\varphi_h - \varphi_{CCF}\left[\int_{-\infty}^{\infty} s(t) \cdot g(t-\tau)\,dt\right]\right\}$$

wherein:
τ—denotes the time displacement of the trigger signal relative to the timing of the zero phase of the system clock
T—denotes the period of the system clock
$\phi_h$—denotes the constant phase difference, which is determined by the signal form of the trigger signal
$\phi_{CCF}$—denotes the phase of the cross correlation function The object is now to determine this correlation integral preferably with an analog circuit. Assuming that the trigger signal [s(t)] is limited in time, the integration limits can be limited to the temporal range, in which s(t) is not equal to zero. This is possible for all trigger-signal forms investigated apart from the simple slope.

$$\tau = \frac{T}{2\pi}\left\{\varphi_h - \varphi_{CCF}\left[\int_{-\frac{T}{2}}^{\frac{T}{2}} s(t)\cdot g(t-\tau)\,dt\right]\right\}$$

Accordingly, it can be guaranteed that the evaluation of the trigger event can be concluded in finite time.

A correlation integral consists of a multiplication of two signals followed by an integration. Accordingly, for a circuit consisting of analog switching elements, the task consists in realising the analog operations, forming the product of two signals and the subsequent integration.

Both operations can be realised relatively easily using analog hardware by a multiplication in the mixer 23 and integration of the intermediate frequency by the analog integrator 28, which is illustrated in FIG. 5. Since the integration time is limited, the integration amplifier can also be designed as a low-pass filter with very small cut-off frequency relative to the clock frequency. It can be shown that the phase of the signal after the integration is proportional to the time offset of the occurrence of the trigger event.

FIG. 5 shows the IQ diagram at the output of the integrator 28, which, relative to the phase of eight uniformly-distributed trigger events, also contains eight different phase values, which agree with the anticipated reference values. In this context, possible error sources should be sought in the 90° hybrid coupler and in the symmetry of the I branch and the Q branch. In the case of unequal amplifications in both branches, or respectively in the case of a non-symmetrical hybrid coupler, these errors are expressed in the form of an IQ amplification error or respectively a quadrature error. These types of error must be picked up in the calibration.

In order to realise an unambiguous slope, the comparator 20, which generates this slope from a comparison of the input signal with a reference value, is initially advantageous. Following this, the trigger signal differentiated in the differential stage 21 is further amplified by the limiter amplifier 22, in order to maximise the steepness of the slope. The limiter amplifier 22 should preferably also contain two additional control inputs: one input for slope selection to control the positive or negative slope, and one "Enable" input to block downstream trigger logic units in the event of a multiple triggering, releasing them only when the results of the trigger event have been read out.

The limiter amplifier 22 was simulated on the basis of concrete transistor models. The simulations implemented show that slope steepnesses of approximately 30-40 ps were achieved. This is sufficient for the detection according to the cross correlation method.

Figure 6:
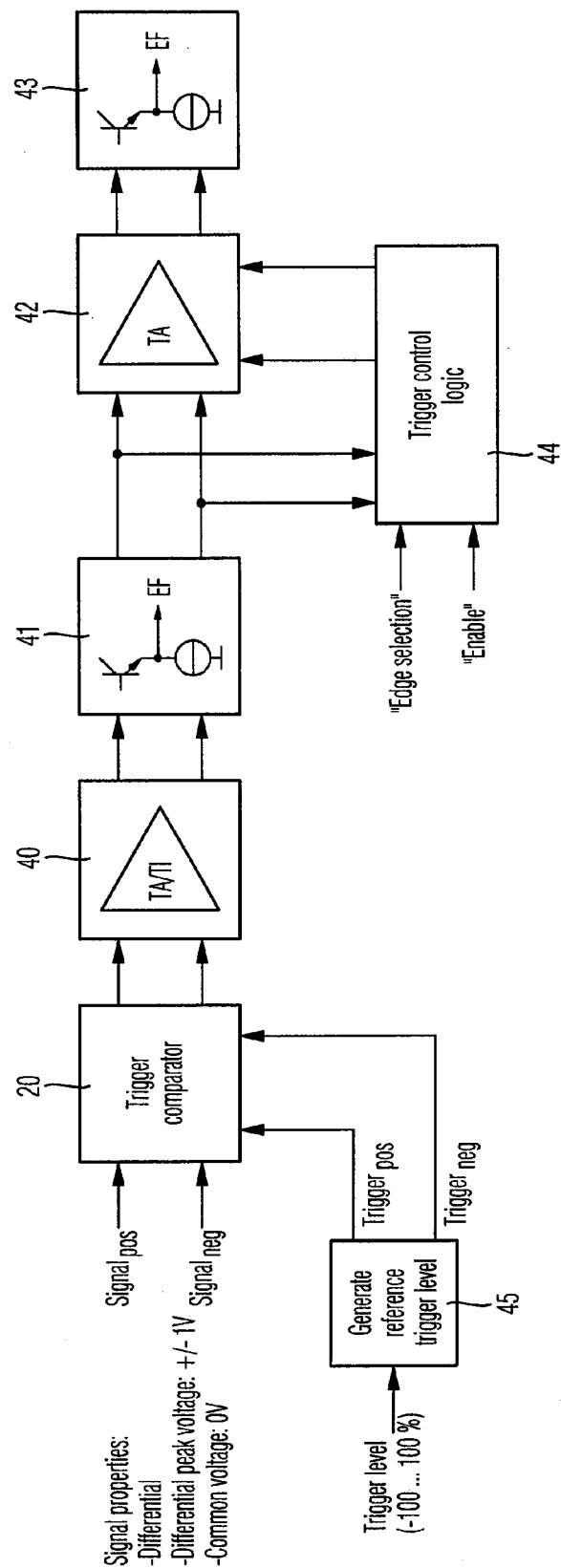
FIG. 6 shows a block-circuit diagram of the input comparator according to FIG. 5 including the control signals and limiter amplifier.

The block-circuit diagram shown in FIG. 6 was simulated in order to test feasibility. It consists of the trigger comparator 20, the amplifier 40, the emitter follower 41, the further amplifier 42 and the further emitter follower 43. The positive trigger slope trigger$_{pos}$ and the negative trigger slope trigger$_{neg}$ of the trigger signal are generated in the block 45. The logic unit of the trigger control is contained in block 44.

Figure 7:
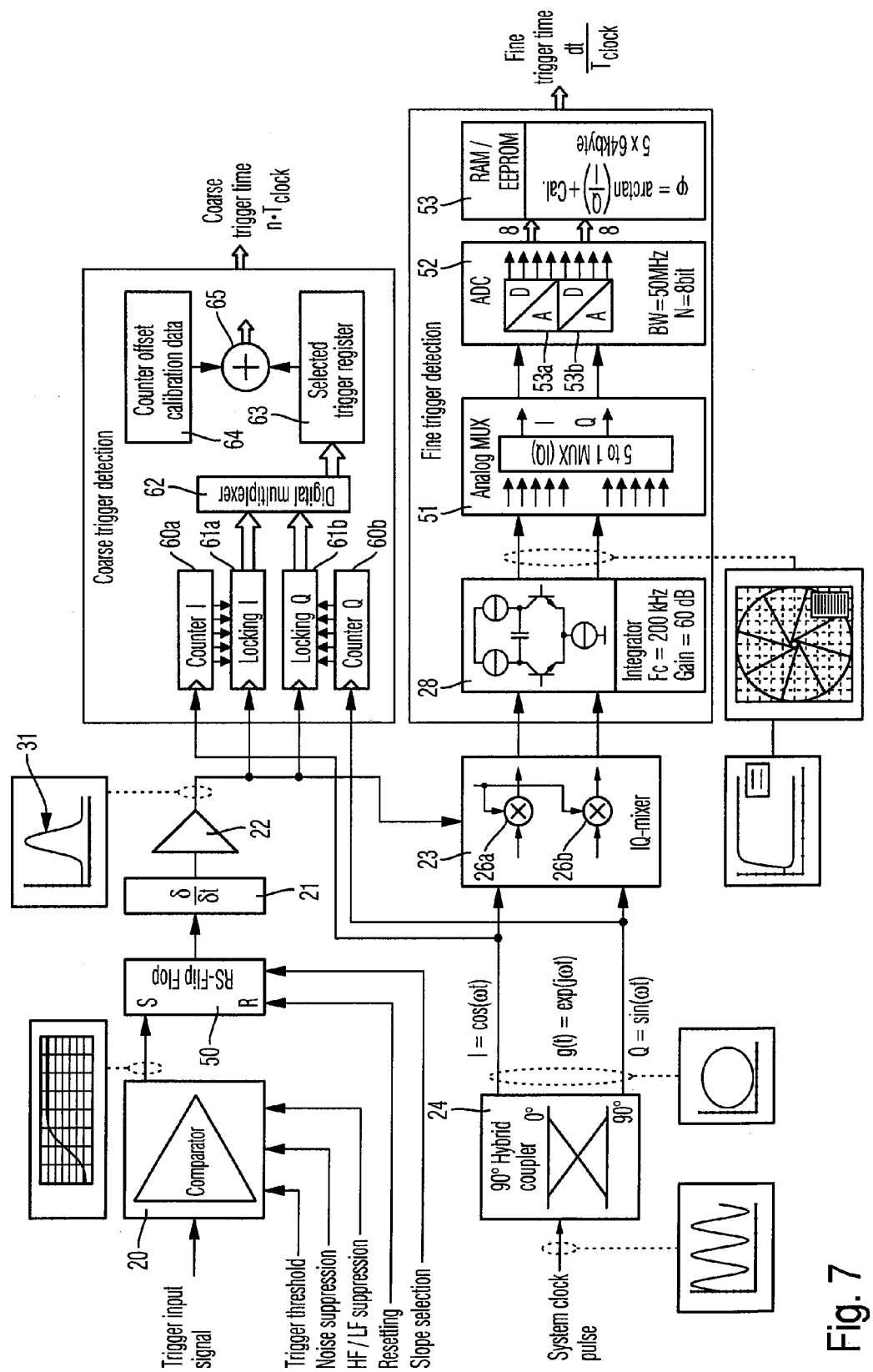
FIG. 7 shows a block-circuit diagram of the trigger-time detector according to a second exemplary embodiment, which operates using the cross correlation of the system clock and a known trigger function.

FIG. 7 shows a second exemplary embodiment of the device according to the invention. Elements already described with reference to FIG. 5 are shown with identical reference numbers to avoid unnecessary repetition of the description.

By contrast with the exemplary embodiment illustrated in FIG. 5, an RS flip-flop 50 is disposed between the trigger comparator 20 and the differential stage 21. The further processing after the integrator 28 is also shown. The illustrated exemplary embodiment provides an analog multiplexer 51, which allows a switching between several evaluation channels, but which is, of course, not necessary in the case of a single-channel design. This is followed by an analog digital conversion unit 52, which comprises a first analog/digital converter 53a for the real component I and a second analog/digital converter 53b for the imaginary component Q.

The output signal of the differential stage 21 is supplied via an amplifier 22 to the RF port of a complex mixer 23. The complex signal of the system clock is disposed at the LO port of the complex mixer 23. This can be generated, for example, by a 90° hybrid coupler 24. Accordingly, the mixer 23 implements a complex multiplication of the Gaussian-like signal from the RF port by the complex rotary phasor of the LO port. The resulting output signal therefore corresponds to the analog multiplication required in the cross correlation integral:

$$s(t)\cdot\exp(j\omega t).$$

The low-pass filter 27 possibly following in sequence by analogy with FIG. 5 and the integration filter 28 realise an analog integration of the signal, so that the analog, complex value of the cross correlation is provided at the output of the integration filter 28.

$$\int s(t)\cdot\exp(j\omega t)\,dt$$

In this case, the active low-pass filter is used to suppress high-frequency mixer-signal components of the mixer output and at the same time amplifies the useful component of the signal.

The digital values generated by the analog/digital conversion unit 52 are stored in a memory 53 and converted into the phase values in a manner still to be described in greater detail with reference to FIGS. 8 and 9. The fine time delay dt relative to the clock period T$_{clock}$ can then be determined from these values as described above.

By way of completion, FIG. 7 once again shows the detection of the coarse time delay n·T$_{clock}$ in units of the clock period T$_{clock}$. For this purpose, a first counter 60a is provided for the real component I and a second counter 60b is provided for the imaginary component Q. The current counter level of the first counter 60a is communicated to a first locking circuit 61a, while the counter level of the second counter 60b is communicated to a second locking circuit 61b. The locking circuits 61a and 61b are locked or respectively triggered by the input signal, and the result is transferred via a digital multiplexer to a trigger register 63. The digital multiplexer 62 is only necessary if several channels are to be observed at the same time. Any calibration data can be present in an offset register 64 and can be added to the result via an adder 65. The coarse time delay is then provided in units of the clock period T$_{clock}$ at the output of the adder 65.

According to FIG. 7, the input signal is initially amplified via the input comparator 20 and compared with the trigger threshold. The RS flip-flop 50 generates from this a slope, which always provides the same gradient. The slope rise time is conventionally approximately, for example, 50 ps. This slope must now be delayed by a given adjustable value. The magnitude of this delay depends upon the run-time differences of the signal paths within the system. The differential run-time delays between the channels must be measured during the calibration and compensated in the analog branch. The initially-generated steep slope is first delayed in a defined manner. In this context, a second-order low-pass filter can advantageously be used. The step response of a filter of this kind is largely linear within a given level range. In this context, the maximum linearity error is 10%. The curve obtained in this manner is then compared by means of a trigger comparator with an adjustable trigger threshold, which is not illustrated. The value to be set is obtained from a characteristic curve, which depends substantially upon the step response of the low-pass filter. A delay dependent upon the digital/analog converter level is now obtained at the output of the second comparator.

The RS flip-flop 50 can be configured for positive trigger slopes and also for negative trigger slopes via a control line ("Slope Select"). The flip-flop 50 can be reset via a RESET line, in order to prepare the component to receive the next trigger event. The component is only released, when the results of the trigger event have been read out. Finally, the slope at the output of the RS flip-flop 50 is converted by the differential stage 21 into a Gaussian-like pulse 31.

The simplest possibility for analog/digital conversion of the complex value after the integration filter is provided by two analog/digital converters 53a and 53b. 50 MHz analog/digital converters are sufficient for this functionality. Now, the phase information is the parameter to be determined for the evaluation of the trigger timing. A computational evaluation of the I/Q data according to modulus and phase is possible only with difficulty in an external processor at a data rate of 50 MHz. In order to resolve this problem, two suggestions are made.

Figure 8:
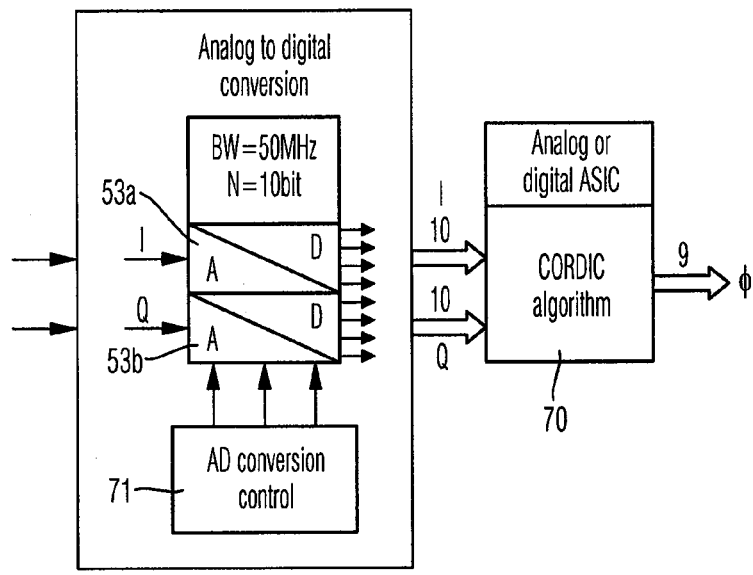
FIG. 8 shows a detail from FIG. 7.

The option shown in FIG. 8 consists of an exploitation of the CORDIC algorithm, for example, in the same ASIC 70 or in an ASIC 70 connected downstream. The control of the analog/digital converters 53a and 53b is implemented with the control unit 71.

Figure 9:
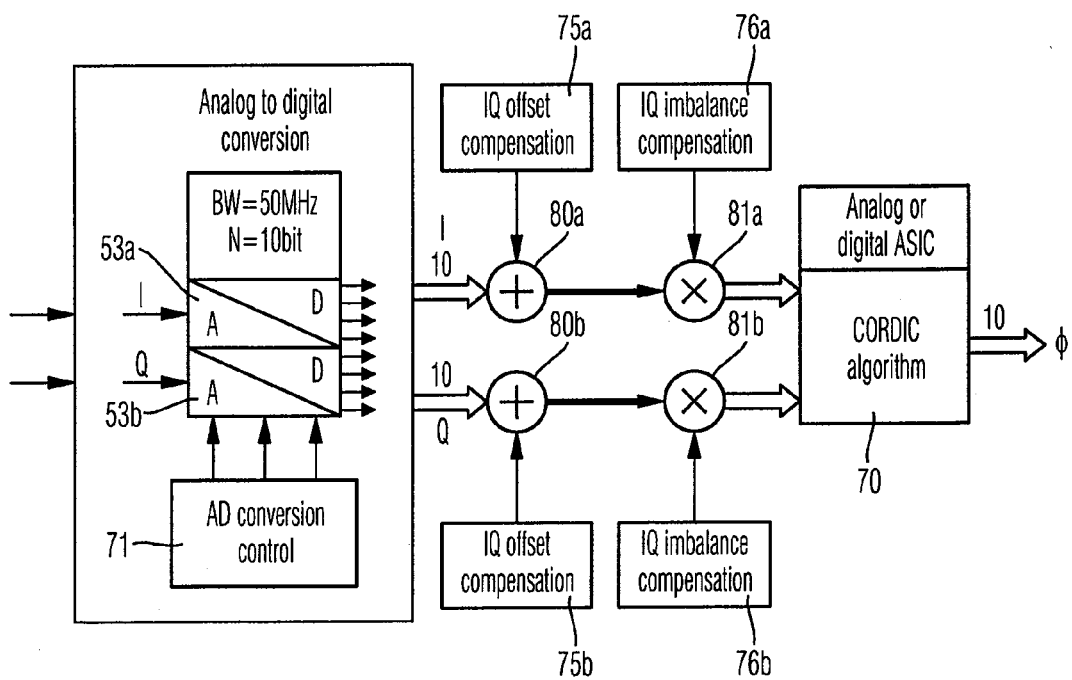
FIG. 9 shows the detail from FIG. 7 in a transformation according to a third exemplary embodiment.

In the exemplary embodiment according to FIG. 9, an adder 80a and respectively 80b for the compensation of the IQ offset 75a and respectively 75b, and a multiplier unit 81a and respectively 81b for the compensation of the IQ imbalance 76a and respectively 76b is connected upstream of the CORDIC algorithm in order to correct errors occurring within the system as a result of IQ distortion.

Figure 10:
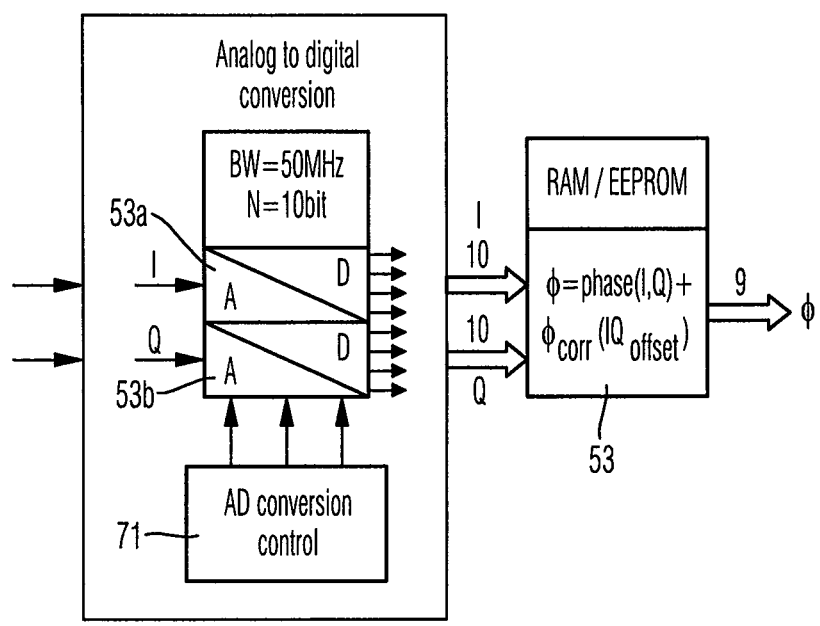
FIG. 10 shows the detail from FIG. 7 in a transformation according to a fourth exemplary embodiment.

The second option, which is shown in FIG. 10, consists in connecting downstream a memory 53, with a two-dimensional input address space (I-10 bit/Q-10 bit→2×10 bit). The phase values of the input I/Q value pairs are now stored in the memory 53. The size of the address space can be reduced while maintaining the same accuracy, if a gradient table for linear interpolation is used. The advantage is that, after a calibration, the error values from the IQ offset and IQ imbalance can be taken into consideration and corrected in the tables.

Figure 11:
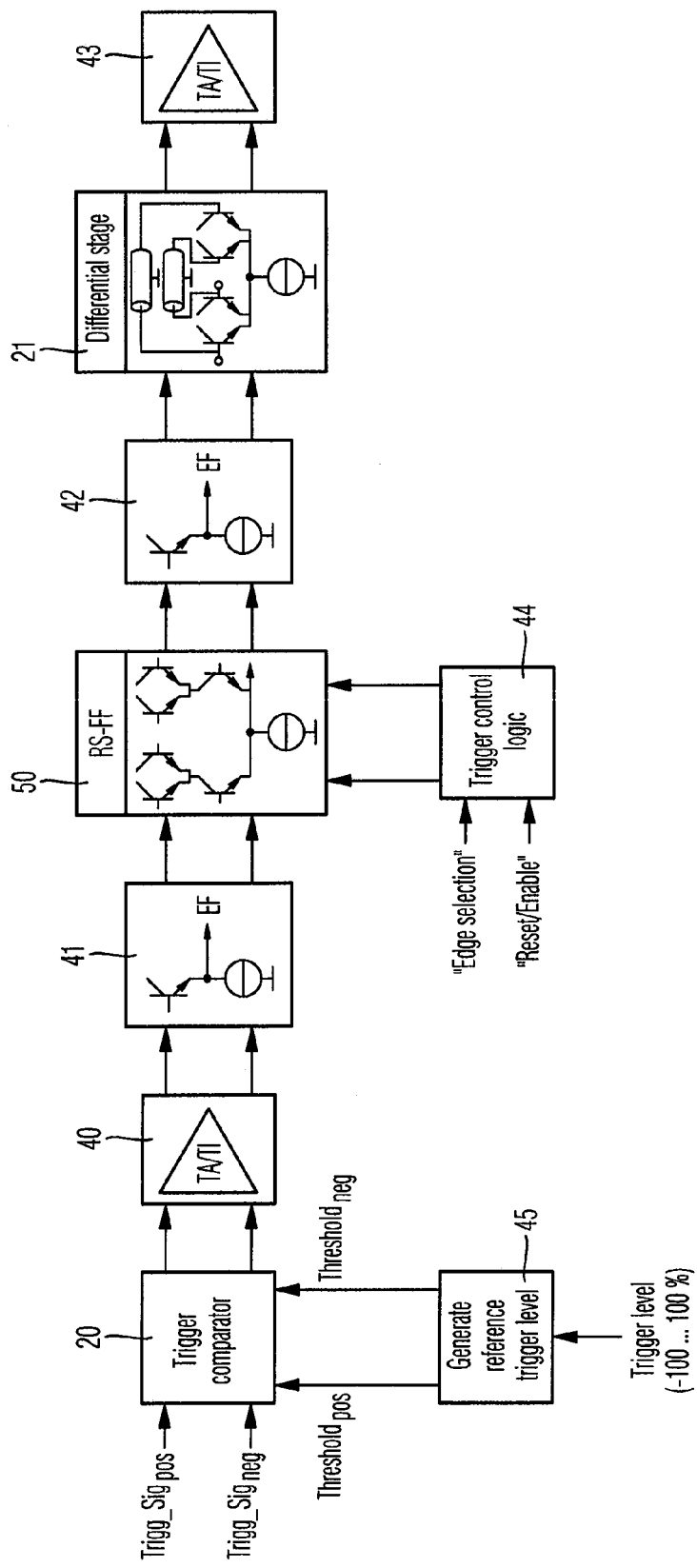
FIG. 11 shows a block-circuit diagram of the input comparator according to FIG. 7.

The block-circuit diagram of the input comparator illustrated in FIG. 11 consists of the trigger comparator 20, the amplifier 40, the emitter follower 41, the RS flip-flop 50, a further emitter follower 42, the differential stage 21 and a final amplifier 43. All of the circuit elements are designed using ECL technology. Accordingly, all the signals are conveyed in a differential manner (positive or respectively negative). In the block "Generate reference trigger level" 45, the externally-set reference level is converted into a corresponding differential signal (threshold$_{pos}$/threshold$_{neg}$). This is compared with the trigger input signal (Trig_Sig$_{pos}$/Trig_Sig$_{neg}$) in the trigger comparator 20.

A separate control unit 44 takes over the configuration of the RS flip-flop 50. This adjusts whether the triggering should take place on a positive or negative slope ("EDGE/SELECT"). The release of the trigger function ("ENABLE") and/or the resetting of the RS flip-flop 50 ("RESET") are also taken over by this control unit.

The differential element 51 is also designed for differential signals. The functionality in this context can be implemented by subtracting a run-time-delayed signal from the input signal. The run-time delay can be achieved by means of differential delay lines. The length of these delay lines is determined by the wavelength of the system clock (for example, 10 GHz) and is one quarter of the wavelength of the system clock. Subtraction from the input signal is implemented through an exchange of the delayed, differential signals in pairs with a subsequent, analog, differential addition circuit. In this context, a delayed, inverted-sign, differential signal is added to the input signal. As a result, a low-cost, a differential stage with a reproducible, determinable time constant can be realised.

Finally, the differentiated signal is once again amplified by the amplifier 43. The differential element is connected by the emitter follower 42 to the output of the RS flip-flop 50.

The invention is not restricted to the exemplary embodiment presented. All of the features described and illustrated can be combined with one another as required within the framework of the invention. The multiplexers 51 and 62 are not required with a single-channel embodiment. Inter alia, the low-pass filter 27 and the differential stage 21 are also not absolutely necessary.

KEY TO DRAWINGS

FIG. 1

| | |
|---|---|
| DUT | Device under test |
| Analoge Messung | Analog measurement |
| Aufnahme Puffer | Recording buffer |
| Zeitabgleich der aufgenommenen Daten | Time adjustment of recorded data |
| Spur Daten | Track data |
| Stand der Technik | Prior art |
| Externer Trigger | External trigger |
| Auswahl der Trigger Quelle | Selection of trigger source |
| Zeit Messung und Synchronisations System | Time measurement and synchronisation system |

FIG. 2

| | |
|---|---|
| Zeitmessungs und Synchronisations-System | Time measurement and synchronisation system |
| Grobe Zeitmessung | Coarse time measurement |
| Berechnung der totalen Zeit-Differenz | Calculation of total time difference |
| Zeit-Differenz | Time difference |
| Feine Zeitmessung | Fine time measurement |
| System Takt | System clock pulse |

FIGS. 3 and 4

| | |
|---|---|
| Puls Formen | Pulse forms |

FIG. 5

| Trigger Eingangs Signal | Trigger input signal |
| Trigger Komparator | Trigger comparator |
| Differential Stufe | Differential stage |
| Trigger Schwelle | Trigger threshold |
| Edge Auswahl | Edge selection |
| Tiefpass | Low-pass filter |
| System Takt | System clock pulse |
| Mischstufe | Mixer stage |

FIG. 6

| Signal Eigenschaften | Signal properties |
| Differential | Differential |
| Diff. Spitze Volt | Differential peak voltage |
| Gemeinsam. Volt | Common voltage |
| Trigger Komparator | Trigger Comparator |
| Trigger Pegel | Trigger level |
| Generiere Ref. Trig Pegel | Generate reference trigger level |
| Edge Auswahl | Edge selection |
| Trigger Steuer Logik | Trigger control logic |

FIG. 7

| Trigger Eingangs Signal | Trigger input signal |
| Komparator | Comparator |
| Grobe Trigger Detektion | Coarse trigger detection |
| Zähler | Counter |
| Zählerversatz Kalibrations Daten | Counter offset calibration data |
| Verriegelung | Locking |
| Digitaler Multiplexer | Digital multiplexer |
| Auserwähltes Trigger Register | Selected trigger register |
| Grobe Trigger Zeit | Coarse trigger time |
| Trigger Schwelle | Trigger threshold |
| Rauschunterdrückung | Noise suppression |
| HF/LF Unterdrückung | HF/LF suppression |
| Rücksetzen | Resetting |
| Slope Selektion | Slope selection |
| System Takt | System clock pulse |
| Hybrid Koppler | Hybrid coupler |
| IQ Mischer | IQ-mixer |
| Feine Trigger Detektion | Fine trigger detection |
| Feine Trigger Zeit | Fine trigger time |

FIGS. 8, 9 and 10

| Analog zu Digital Konvertierung | Analog to digital conversion |
| AD Konvertierungs Steuerung | AD conversion control |
| Analog oder Digital ASIC | Analog or digital ASIC |
| Algorithmus | Algorithm |
| Kompensation | Compensation |

FIG. 11

| Trigger Komparator | Trigger comparator |
| Generiere Ref. Trig. Pegel | Generate reference trigger level |
| Trigger Pegel | Trigger level |
| Trigger Steuer Logik | Trigger control logic |

The invention claimed is:

1. A method executed by a circuit to determine the temporal position of an analog trigger signal relative to an analog clock signal, comprising:
    determining a cross correlation between the trigger signal and the clock signal; and
    determining the temporal position from a phase of the cross correlation,
    wherein the trigger signal is supplied to a flip flop and is differentiated for increasing the steepness of the trigger signal.

2. The method according to claim 1, wherein the cross correlation is determined by an analog, complex mixing of the trigger signal and the clock signal.

3. The method according to claim 2, further comprising:
    integrating the cross correlation with an integrator after the analog mixing.

4. The method according to claim 3, further comprising:
    low-pass filtering the cross correlation between the analog mixing and the analog integration.

5. The method according to claim 2, wherein the analog trigger signal is conditioned before the mixing by differentiation in a differential stage.

6. The method according to claim 5, further comprising:
    comparing the trigger signal with a trigger threshold value before the differentiation.

7. The method according to claim 2, wherein the analog clock signal is conditioned before the mixing by determining its real component (I) and its imaginary component (Q).

8. A device for determining a temporal position of an analog trigger signal relative to an analog clock signal comprising:
    an analog cross correlator, which implements an analog cross correlation between the trigger signal and the clock signal; and
    a signal concatenation of a flip flop and a differentiator for increasing the steepness of the trigger signal precedes the analog cross correlator.

9. The device according to claim 8, wherein the cross correlator includes an analog complex mixer, which mixes the trigger signal and the clock signal with one another.

10. A device according to claim 9, wherein the cross correlator includes an analog integrator, which is connected downstream of the analog mixer.

11. A device according to claim 10, further comprising:
    an analog low-pass filter disposed between the analog mixer and the analog integrator.

12. A device according to claim 9, further comprising:
    an analog differential stage, which differentiates the analog trigger signal before it is supplied to the mixer.

13. A device according to claim 9, further comprising:
    an analog trigger comparator disposed upstream of the mixer, which compares the analog trigger signal with a trigger-threshold value.

14. The device according to claim 9, further comprising:
    an analog coupler disposed upstream of the mixer, which analyzes the analog clock signal into its real component (I) and its imaginary component (Q) before the mixing.

15. A device according to claim 14, further comprising:
    an analog/digital converter for the real component (I) and for the imaginary component (Q) respectively is connected downstream of the cross correlator.

16. A device according to claim 15, further comprising:
    means for calculating the phase angle (T) from the digitized real component (I) and the digitized imaginary component (Q) or for reading out the phase angle (T) from a table stored in a memory.

* * * * *